United States Patent [19]

Galani et al.

[11] 4,129,839
[45] Dec. 12, 1978

[54] RADIO FREQUENCY ENERGY COMBINER OR DIVIDER

[75] Inventors: Zvi Galani, Bedford; Steven J. Temple, Arlington, both of Mass.

[73] Assignee: Raytheon Company, Lexington, Mass.

[21] Appl. No.: 807,859

[22] Filed: Jun. 20, 1977

Related U.S. Application Data

[63] Continuation-in-part of Ser. No. 775,801, Mar. 9, 1977, abandoned.

[51] Int. Cl.² .............................................. H01P 5/12
[52] U.S. Cl. ................................... 333/9; 330/124 R
[58] Field of Search .................................. 333/6, 9

[56] References Cited

U.S. PATENT DOCUMENTS

| | | | |
|---|---|---|---|
| 3,091,743 | 5/1963 | Wilkinson | 333/9 |
| 3,422,377 | 1/1969 | Vient | 333/9 |
| 3,691,485 | 9/1972 | Beck | 333/9 X |

OTHER PUBLICATIONS

Parad et al., *Split-Tee Power Divider*, IEEE Trans. on MTT, Jan. 1965, vol. MTT-13, No. 1, pp. 91-95.

*Primary Examiner*—Paul L. Gensler
*Attorney, Agent, or Firm*—Philip J. McFarland; Joseph D. Pannone

[57] ABSTRACT

Circuitry for dividing radio frequency energy between a plurality of loads is shown in one embodiment to consist of particular printed transmission lines and isolating resistors on a common substrate, each one of such lines forming a path between an input port to which radio frequency energy is applied and a different one of a plurality of output ports to which the loads are connected.

Circuitry for amplifying radio frequency energy from a source thereof is shown in the second embodiment to consist of dividing circuitry such as is shown in the first embodiment, a field effect transistor connected to each output port to amplify each portion of the divided radio frequency energy and dividing circuitry such as is shown in the first embodiment, such circuitry being connected in a mirror fashion to the field effect transistors to combine the amplified portions of the radio frequency energy at a single port.

The lengths of printed transmission lines in the second embodiment are all equal.

2 Claims, 3 Drawing Figures

RADIO FREQUENCY ENERGY COMBINER OR DIVIDER

CROSS-REFERENCE TO RELATED APPLICATIONS

This is a continuation-in-part of application Ser. No. 775,801 filed Mar. 9, 1977, now abandoned.

BACKGROUND OF THE INVENTION

This invention pertains generally to microwave power combiners or dividers and particularly to planar, broadband power combiners or dividers suitable for either stripline of microstrip with any number of terminations.

As is known in the art, amplifiers using Field Effect Transistors (FETs) are becoming increasingly attractive for use as microwave power sources because of the relatively broad bandwidth attainable with such transistors. FETs to date have, however, been power limited, with devices capable of delivering 1 watt of output power at X-band only recently becoming available. In a typical application where a solid state transmitter is desired, it is usually necessary to combine the outputs of several FET amplifiers together by means of a microwave power combiner to attain a useful power output. Any such power combiner must provide a minimum of 10 dB isolation between its input and output ports in order to prevent the failure of a single amplifier from seriously degrading the performance of the remaining amplifiers and must be symmetrical to avoid phase and amplitude imbalances. In general, many known combiners are in the form of a planar array of T-junctions, thereby making the number of input ports equal to an integral power of two. Therefore, if, for example, the outputs of nine FETs are to be combined, an array of T-junctions having sixteen input ports would be required. In applications where space is at a premium, as, for example, in missile and aircraft installations, such a combiner is obviously undesirable. Furthermore, if such an array were to be used as a 9:1 power divider by applying power to the "input" port and taking power from the "output" ports, seven of the sixteen "output" ports would have to be terminated in matched loads which would dissipate 7/16ths of the applied power.

A known power divider, as is described in an article entitled "An N-Way Hybrid Power Divider" by E. J. Wilkinson, IRE Transactions Microwave Theory and Techniques, vol. MTT-13, pp. 116-118, January 1960, can provide an odd number of output ports. However, because the so-called "Wilkinson divider" employs circular symmetry, it also presents a serious packaging problem in that it cannot be realized in a planar structure, except for the case where N=2 (N being the number of output ports). A planar power combiner or divider having an odd number of input and output ports can be realized by combining a conventional T-junction power divider with a so-called "Split-T power divider" as described in an article entitled "Split-Tee Power Divider" by L. I. Parad and R. L. Moynihan, IEEE Transactions Microwave Theory and Techniques, vol. MTT-13, pp. 91-95, January 1965. Again, such a combination requires a substantial space for packaging and exhibits a large insertion loss.

SUMMARY OF THE INVENTION

With this background of the invention in mind, it is an object of this invention to provide an improved planar power combiner or divider with any number, N, of input or output ports.

It is another object of this invention to provide a power combiner or divider having very compact packaging characteristics.

These and other objects of the invention are attained generally by providing planar circuitry having N fifty ohm ports (which serve as either output or input ports) connected via N sections of high impedance transmission line, made in stripline or microstrip, to a single port (which serves as either an input or an output port). Each of the N sections of high impedance transmission line preferably is a quarter wavelength long at center band frequency when the planar circuitry is used as a power combiner. Isolation resistors are connected between each pair of the N ports. With such an arrangement, the relative phases of signals passing through the contemplated circuitry is maintained and the N ports isolated one from the other. The contemplated circuitry may be used as a power combiner by applying power to each one of the N ports or as a power divider by applying power to the single port.

BRIEF DESCRIPTION OF THE DRAWINGS

The foregoing features of this invention as well as the invention itself may be more fully understood from the following detailed description read together with the accompanying drawings, wherein.

DESCRIPTION OF THE PREFERRED EMBODIMENTS

Figure 1:
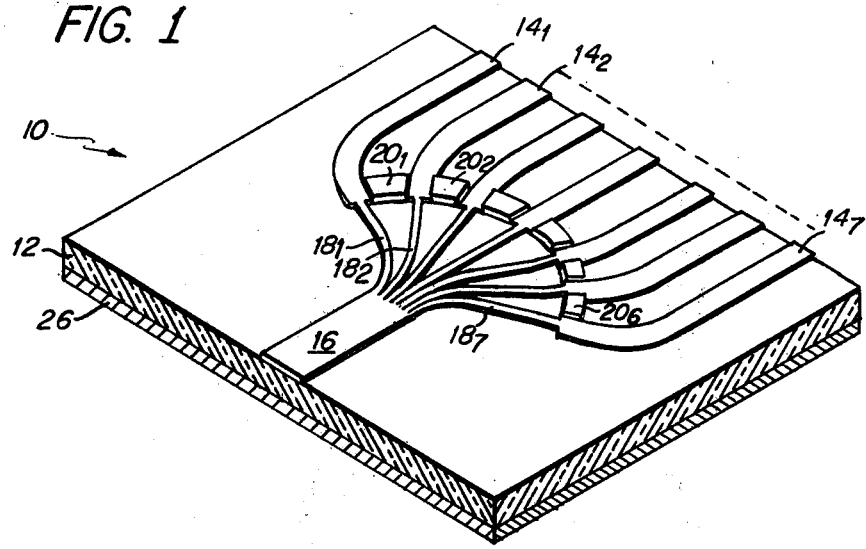
FIG. 1 is a view of the printed circuitry of a planar N-way power divider according to the invention.

Referring now to FIG. 1, a planar divider 10 (sometimes hereinafter referred to simply as divider 10 where the input power is divided equally between seven output ports, i.e. N=7) is shown to include circuitry (not numbered) disposed on a flat surface, here designated dielectric material 12. The circuitry is formed by depositing or printing a conducting material (here copper) in any conventional manner on a portion of the surface of the dielectric material 12. Such dielectric material may, for example, be the material known as "Duroid 5880", manufactured by the Rogers Corp., Chandler, Arizona. The circuitry includes seven output arms $14_1$, $14_2$-$14_7$ and a single input arm 16. Output arms $14_1$, $14_2$-$14_7$ (each of which is here a section of 50 ohm transmission line), is connected as shown through a section of each one of N high impedance transmission lines $18_1$, $18_2$-$18_7$ to the inner end of the input arm 16, which is also a section of 50 ohm transmission line. The impedance of the high impedance transmission lines $18_1$, $18_2$-$18_7$ is determined in a manner to be described. The characteristic impedances of the output arms $14_1$, $14_2$-$14_7$ and of the input arm 16 are here taken to be 50 ohms to match conventional coaxial cables, but will differ for different impedances connected to them. Alternatively, as will be shown hereinafter, other microstrip circuitry may be coupled to divider 10. Isolation resistors $20_1$, $20_2$-$20_6$ are provided between arms $14_1$, $14_2$-$14_7$, as shown. Such resistors $20_1$, $20_2$-$20_6$ are attached to arms $14_1$, $14_2$-$14_7$ in any conventional manner, here by means of solder. Isolation resistors $20_1$, $20_2$-$20_6$ are inserted at the inner ends of arms $14_1$, $14_2$–$14_7$ to interface with the high impedance transmission line sections $18_1$, $18_2$–$18_7$, as shown. It is here noted that the length of high impedance transmission line sections $18_1$, $18_2$–$18_7$ is equal to a quarter-wavelength at the center band frequency. The length of arms $14_1$, $14_2$–$14_7$ and 16, on the other hand, is not critical and the length of these arms is chosen simply to provide packaging convenience. It is noted, however, that in order to maintain phase symmetry, arms $14_1$, $14_2$–$14_7$ are preferably of equal length. It is noted here that, although the free end of each one of the arms $14_1$, $14_2$–$14_7$ may be considered to be a port, in practice each such end would ordinarily be connected in a known manner to a connector (such as a coaxial connector) to allow the contemplated power divider to be easily connected in circuit between a power source and seven loads.

Figure 1A:
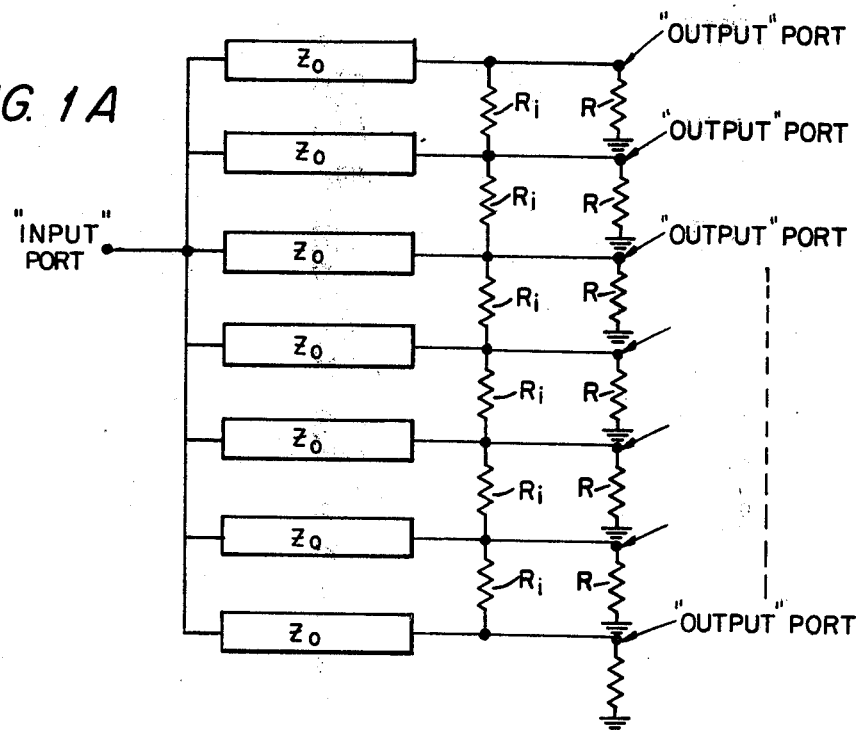
FIG. 1A is a schematic diagram of the printed circuitry of FIG. 1.

It is here noted that the divider as described and shown in FIGS. 1 and 1A has seven output arms, i.e. N=7, simply to illustrate the fact that the contemplated design does not require that the number of input ports be equal to a power of two. Referring in particular to FIG. 1A to see what the symbols $Z_o$, R and $R_i$ mean, it may be shown that, in an N:1 divider having an optimum VSWR, the value, $Z_o$, of the characteristic impedance of each one of the high impedance quarter-wave lines is:

Eq. (1) $Z_o = R N^{\frac{1}{2}}$ where N is the number of "output" arms. Also, it may be seen that adjacent output ports are interconnected with equal value resistors $R_i$. The values of $Z_o$, which is the characteristic impedance of each one of the high impedance quarter-wave lines, and $R_i$ are selected based upon a tradeoff between the input/output port VSWR and the uniformity in isolation between the N output ports.

It has been found that the values of $Z_o$ and $R_i$ which produced the lowest input and output VSWR (less than 1.05 at the center band frequency) resulted in a relatively wide variation in isolation between the various output ports, ranging from 10 dB to 28 dB. The distribution of isolation between the output ports can be made more uniform by proper selection of $Z_o$ and $R_i$, with a corresponding increase in input and output VSWR. Presented in TABLE I are values of $Z_o$ and $R_i$ for N=2 to N=10, which yield the lowest input and output port VSWR.

TABLE I

| N | $Z_o$ (Ohms) | $R_i$ (Ohms) |
|---|---|---|
| 2 | 70.7 | 100.0 |
| 3 | 86.6 | 150.0 |
| 4 | 100.0 | 122.5 |
| 5 | 111.8 | 111.8 |
| 6 | 122.5 | 102.7 |
| 7 | 132.3 | 96.5 |
| 8 | 141.4 | 92.0 |
| 9 | 150.0 | 88.8 |
| 10 | 158.1 | 86.2 |

Figure 2:
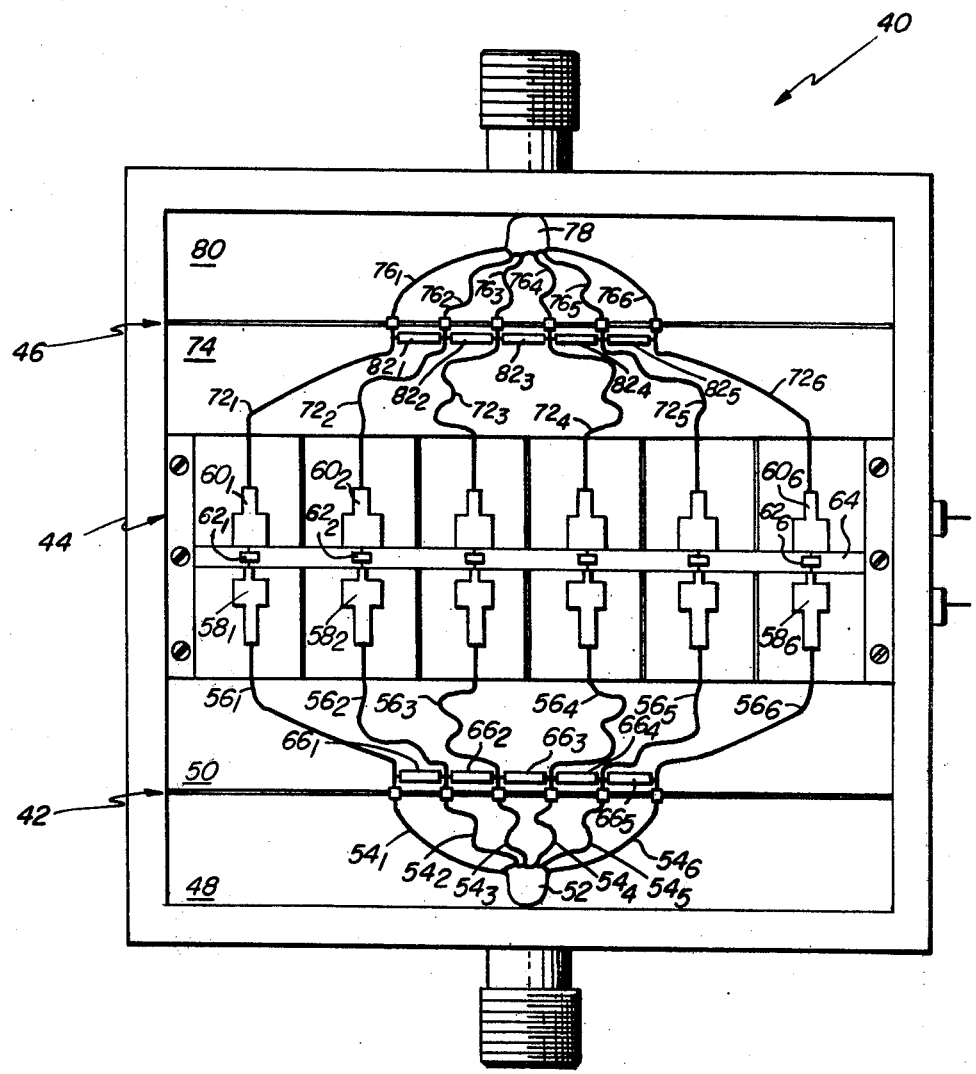
FIG. 2 is a plan view, somewhat simplified, of a planar N-way power combiner according to the invention, such combiner including FET amplifiers.

Referring now to FIG. 2, a typical broadband power combiner 40 (hereinafter sometimes referred to simply as combiner 40), capable of providing 5 watts of output power at X-band, is shown to include an input power distribution section 42, a bank of FET amplifiers 44, and a power combining section 46. The power distribution section 42 here is an N-way (N=6) power divider basically as described hereinabove in connection with FIGS. 1 and 1A. Power distribution section 42 in this embodiment is, however, constructed utilizing microstrip techniques with two different dielectric substrates 48, 50. Dielectric substrate 48, which is here Duroid as in FIG. 1, supports a 50 ohm input line 52 and six high impedance quarter-wavelength line sections $54_1$–$54_6$. Dielectric substrate 50, which is here alumina, supports six 50 ohm output lines $56_1$–$56_6$. The 50 ohm output lines $56_1$–$56_6$ are fabricated on alumina in order to reduce the width of such lines and make them more compatible in width with the high impedance quarter-wavelength line sections $54_1$–$54_6$. Interconnections between the high impedance quarter-wavelength line sections $54_1$–$54_6$ on substrate 48 and 50 ohm output lines $56_1$–$56_6$ on substrate 50 may be made using conventional thermal compression bonded ribbons (not numbered). It is noted, in passing, that fifty ohm output lines $56_2$, $56_3$, $56_4$ and $56_5$ are meandered to maintain the same electrical length as 50 ohm output lines $56_1$, $56_6$. Isolation resistors $66_1$–$66_5$, which are here Model CR chip resistors manufactured by EMC Technology, Inc., 1300 Arch Street, Philadelphia, Pa. 19107 are provided between 50 ohm output lines $56_1$–$56_6$, as shown. The value of isolation resistors $66_1$–$66_5$ is determined from Table I. To aid in installing isolation resistors $66_1$–$66_5$ conventional bonding pads (not shown) are included on each of the 50 ohm output lines $56_1$–$56_6$. Such pads comprise metal tabs protruding out on each side of 50 ohm output lines $56_1$–$56_6$.

The bank of FET amplifiers 44 contains six identical one watt transistors (FETs $62_1$–$62_6$). The input matching network $58_1$–$58_6$ and the output matching network $60_1$–$60_6$ of each of the amplifiers are formed, utilizing microstrip fabrication techniques, on alumina substrates (not numbered). FETs $62_1$–$62_6$ are mounted, in any convenient manner, on a metal ridge 64 disposed between the substrates (not numbered) containing the input matching networks $58_1$–$58_6$ and the output matching networks $60_1$–$60_6$. Appropriate ones of the electrodes from each of FETs $62_1$–$62_6$ are attached to their respective input and output matching networks $58_1$–$58_6$, $60_1$–$60_6$ in any convenient manner, here by means of a low temperature indium solder. It is noted here that the circuitry required for biasing each of FETs $62_1$–$62_6$ is not shown for the sake of clarity.

The power output from each of the six FETs $62_1$–$62_6$ is combined in the power combining section 46, which is identical in design to that of power distribution section 42, but connected in a mirror fashion to the field effect transistors to combine the amplified portions of the radio frequency energy at a single port. Thus, the 50 ohm input line sections $72_1$–$72_6$ are fabricated on an alumina substrate 74, while the quarter-wavelength high impedance line sections $76_1$–$76_2$, as well as 50 ohm output line 78, are fabricated on a Duroid substrate 80. Isolation resistors $82_1$–$82_5$ are identical to those used in power distribution section 42. It will not be obvious that the electrical lengths of the paths from the 50 ohm input line 52 through the 50 ohm output line 78 are equal as shown to maintain the amplified signals at the 50 ohm output line in phase with one another.

Having described a preferred embodiment of the invention, it will now be immediately apparent to those having ordinary skill in the art that the power divider or combiner could just as easily be fabricated utilizing stripline fabrication techniques. Further, the power divider or combiner may be designed to have other than 50 ohm input or output lines and the number, N, or "output" ports may be any integer within very wide limits. Finally, to increase the power handling capability of the isolation resistors, resistors having twice the desired value of resistance may be mounted in parallel. It is felt, therefore, that this invention should not be restricted to its disclosed embodiments, but rather should be limited only by the spirit and scope of the appended claims.

What is claimed is:

1. A power divider having an input port for receiving radio frequency energy within a band of frequencies from a source thereof and N output ports, where N is an integer greater than two, for distributing such energy among N loads, such power divider being fabricated as a printed circuit on one side of a dielectric substrate, the second side of such substrate being covered with an electrically conductive coating, such power divider comprising:
  (a) a first printed transmission line connected to the input port, such line having a characteristic impedance matching the characteristic impedance of the source of electromagnetic energy and having a free end;
  (b) N printed output transmission lines, each one thereof having one end connected to a different one of the output ports and a free end, the characteristic impedance of each one of the N printed output transmission lines being matched to the characteristic impedance of a corresponding one of the loads;
  (c) N printed transmission lines interconnecting the free end of the first printed transmission line and the free end of each different one of the N printed output transmission lines, the characteristic impedance of each one of the printed transmission lines being greater, by a factor of $N^{\frac{1}{2}}$, than the characteristic impedance of each corresponding one of the plurality of loads; and
  (d) N-1 isolating resistors, each different one connected between the junctions of each successive pair of the N printed transmission lines and N printed output transmission lines.

2. A power divider as in claim 1 wherein the electrical length of each one of the like plurality of printed transmission lines equals an odd integral multiple of a quarter-wavelength of the radio frequency energy at the center of the band of frequencies.

* * * * *